(12) United States Patent
Darr (10) Patent No.: US 11,419,230 B1
(45) Date of Patent: Aug. 16, 2022

(54) ELECTRICAL UNIT AND BUSHING (71) Applicant: Lear Corporation, Southfield, MI (US)

(72) Inventor: Christopher J. Darr, Livonia, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 17/205,345

(22) Filed: Mar. 18, 2021

(51) Int. Cl.
*H05K 5/02* (2006.01)
*H05K 5/00* (2006.01)

(52) U.S. Cl.
CPC ......... *H05K 5/0247* (2013.01); *H05K 5/0008* (2013.01); *H05K 5/0043* (2013.01); *H05K 5/0069* (2013.01)

(58) Field of Classification Search
CPC .................................................. H05K 5/0247
See application file for complete search history.

(56) References Cited

U.S. PATENT DOCUMENTS

| | | | |
|---|---|---|---|
| 2,639,179 A | 5/1953 | Phelps | |
| 5,550,712 A | 8/1996 | Crockett | |
| 6,511,340 B1 | 1/2003 | Lopez | |
| 6,591,088 B1 | 7/2003 | Watanabe | |
| 7,227,761 B2 | 6/2007 | Estes et al. | |
| 7,614,897 B2 | 11/2009 | Lopez | |
| 9,422,003 B2 | 8/2016 | Yun et al. | |
| 9,462,702 B2* | 10/2016 | Darr | B60R 16/0239 |
| 9,509,126 B1 | 11/2016 | Carbonell Mate | |
| 2002/0061666 A1* | 5/2002 | Sato | H05K 7/026 439/76.2 |
| 2009/0237893 A1 | 9/2009 | Yang | |
| 2019/0123522 A1 | 4/2019 | Darr et al. | |

\* cited by examiner

*Primary Examiner* — Hung V Ngo
(74) *Attorney, Agent, or Firm* — Fishman Stewart PLLC (57) ABSTRACT

An electrical unit may include an electrical unit housing having a first housing member, a second housing member, and/or a third housing member; a circuit board that may be disposed at least partially in the electrical unit housing; a fastener that may be disposed at least partially in the first housing member, the second housing member, the third housing member, and/or the circuit board; and/or a bushing that may be disposed at least partially in the first housing member, the second housing member, and/or the circuit board. The fastener may be disposed at least partially in the bushing.

20 Claims, 13 Drawing Sheets

ELECTRICAL UNIT AND BUSHING

TECHNICAL FIELD

The present disclosure generally relates to electrical units, including power distribution boxes (PDBs) that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical units are complex, do not provide sufficient functionality, and/or apply unnecessary forces to certain components.

There is a desire for solutions/options that minimize or eliminate one or more challenges or shortcomings of electrical units. The foregoing discussion is intended only to illustrate examples of the present field and is not a disavowal of scope.

SUMMARY

In embodiments, an electrical unit may comprise an electrical unit housing, including a first housing member, a second housing member, and/or a third housing member; a circuit board that may be disposed at least partially in the electrical unit housing; a fastener that may be disposed at least partially in the first housing member, the second housing member, the third housing member, and/or the circuit board; and/or a bushing that may be disposed at least partially in the first housing member, the second housing member, and/or the circuit board. The fastener may be disposed at least partially in the bushing.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
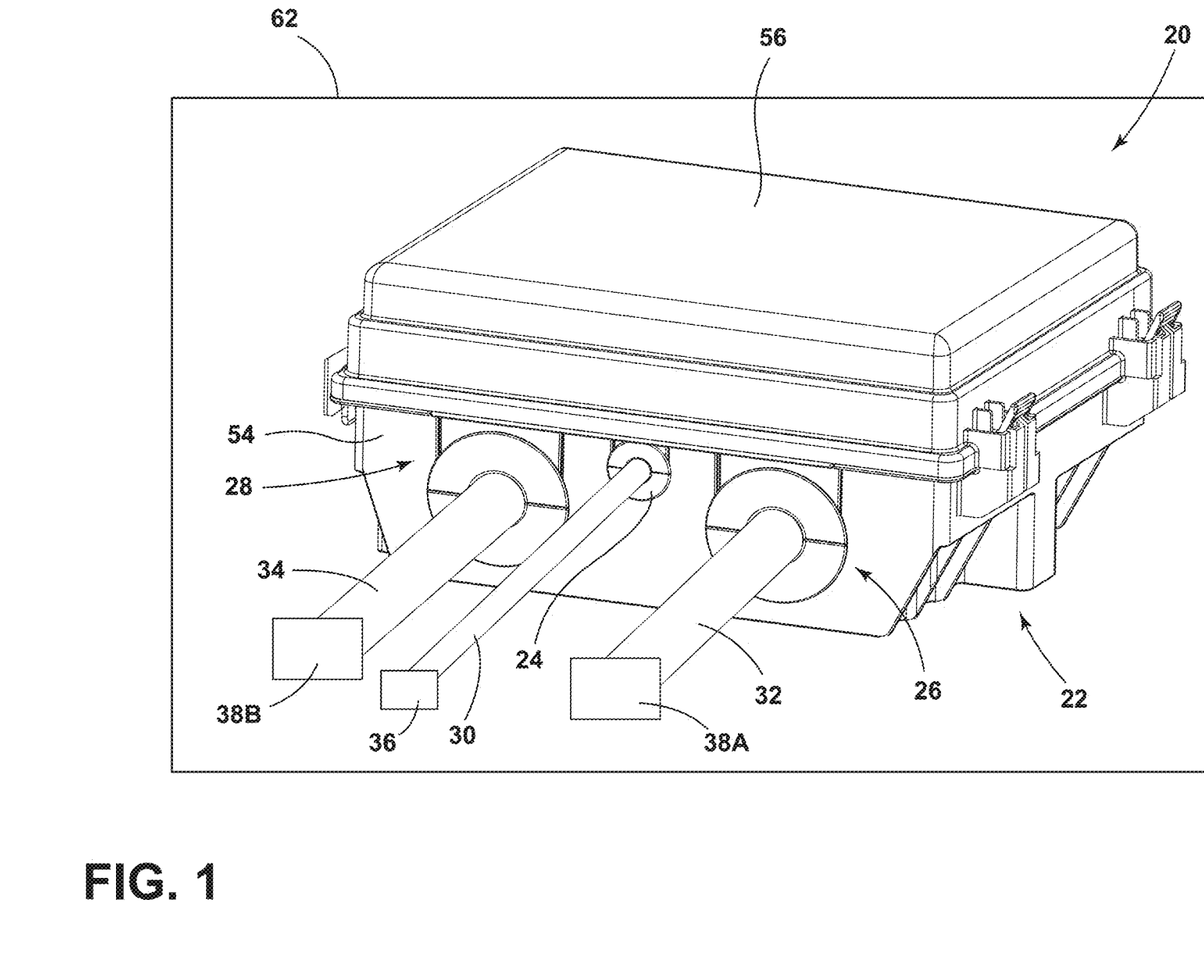
FIG. 1 is a perspective view generally illustrating an embodiment of an electrical unit.

With embodiments, such as generally illustrated in FIG. 1, an electrical unit 20 may include an electrical unit housing 22. An electrical unit 20 may include and/or be connected to one or more electrical connectors, such as a first electrical connector 24, a second electrical connector 26, and/or a third electrical connector 28. The first electrical connector 24 may be connected with a first cable 30. The second electrical connector 26 may be connected with a second cable 32. The third electrical connector 28 may be connected a third cable 34. In embodiments, an electrical unit 20 may be configured as a power distribution unit (PDU) and/or a power distribution box (PDB). For example, the first electrical connector 24 and/or the first cable 30 may be configured to provide electrical power to the electrical unit 20, such as from a power source 36 (e.g., a battery, such as a vehicle battery). The electrical unit 20 may be configured to receive and distribute the electrical power to one or more other components 38A, 38B (e.g., vehicle components/systems), such as via the second connector 26 and the second cable 32, and/or via the third connector 28 and the third cable 34. A second electrical connector 26 and/or a third electrical connector 28 may, for example and without limitation, include a plurality of terminals 26A, 28A (e.g., 30 or more) that may correspond to respective wires of cables 32, 34.

Figure 2:
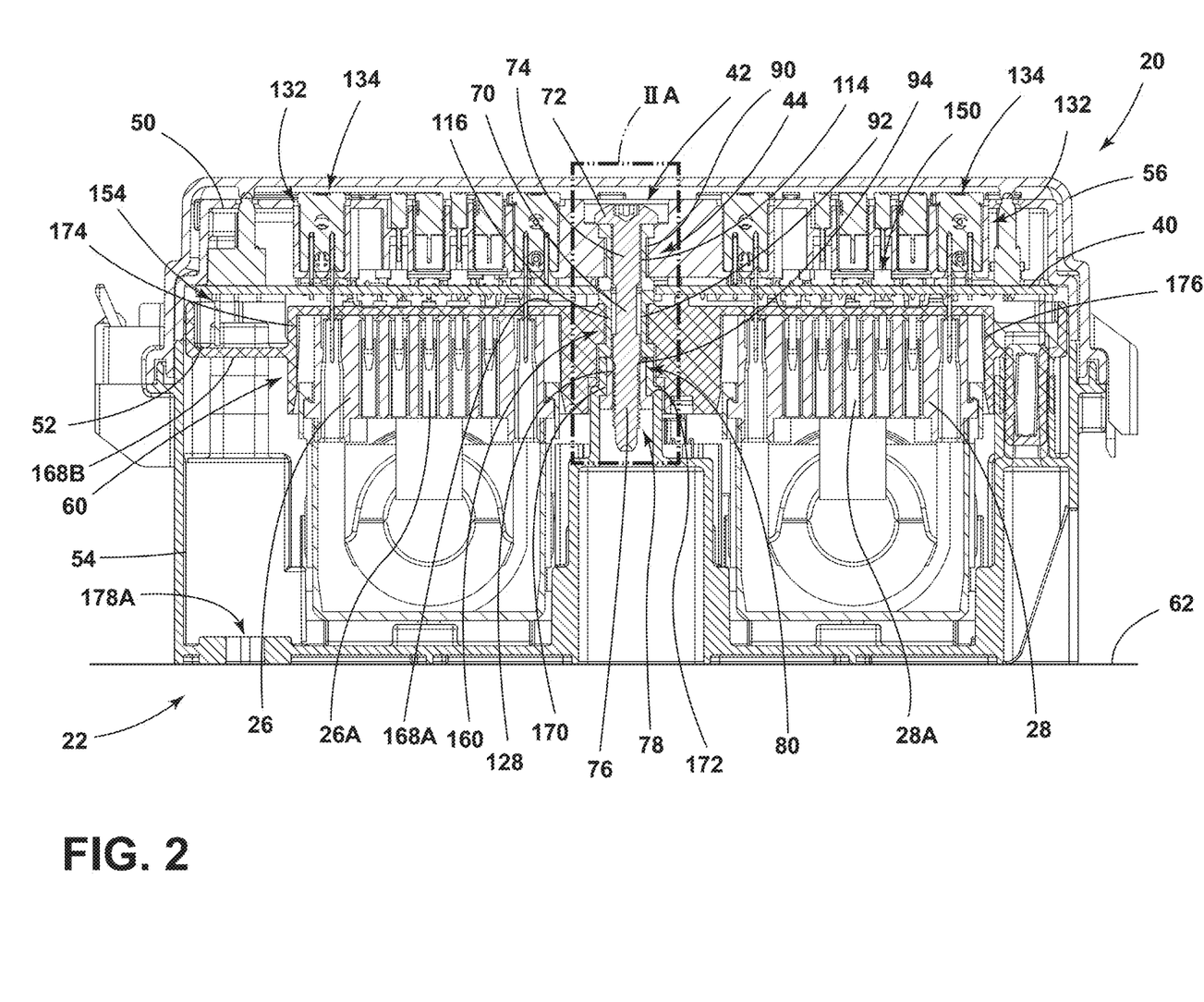
FIG. 2 is a cross-sectional view generally illustrating an embodiment of an electrical unit.

In embodiments, such as generally illustrated in FIG. 2, an electrical unit 20 may include an electrical unit housing 22, a circuit board 40, a fastener 42, and/or a bushing 44. The electrical unit housing 22 may include a first housing member 50, a second housing member 52, a third housing member 54, and/or a cover 56. The cover 56 may be connected to the third housing member 54, such as to define an internal space 60. The first housing member 50, the second housing member 52, the circuit board 40, the fastener 42, and/or the bushing 44 may be disposed partially and/or entirely in the internal space 60. The cover 56, the first housing member 50, the circuit board 40, the second housing member 52, and/or the third housing member 54 may, in some configurations, be disposed in a stacked and/or overlapping configuration. For example, a third housing member 54 may be disposed on and/or connected to a mounting surface 62. The second housing member 52 may disposed at least partially above/on top of the third housing member 54 (and/or one or more of the connectors 24, 26, 28). The circuit board 40 may be disposed at least partially above/on top of the second housing member 52. The first housing member 50 may be disposed at least partially above/on top of the circuit board 40 (e.g., such that the circuit board 40 is disposed substantially between the first housing member 50 and the second housing member 52). The cover 56 may be disposed at least partially above/on top of the first housing member 50.

Figure 3:
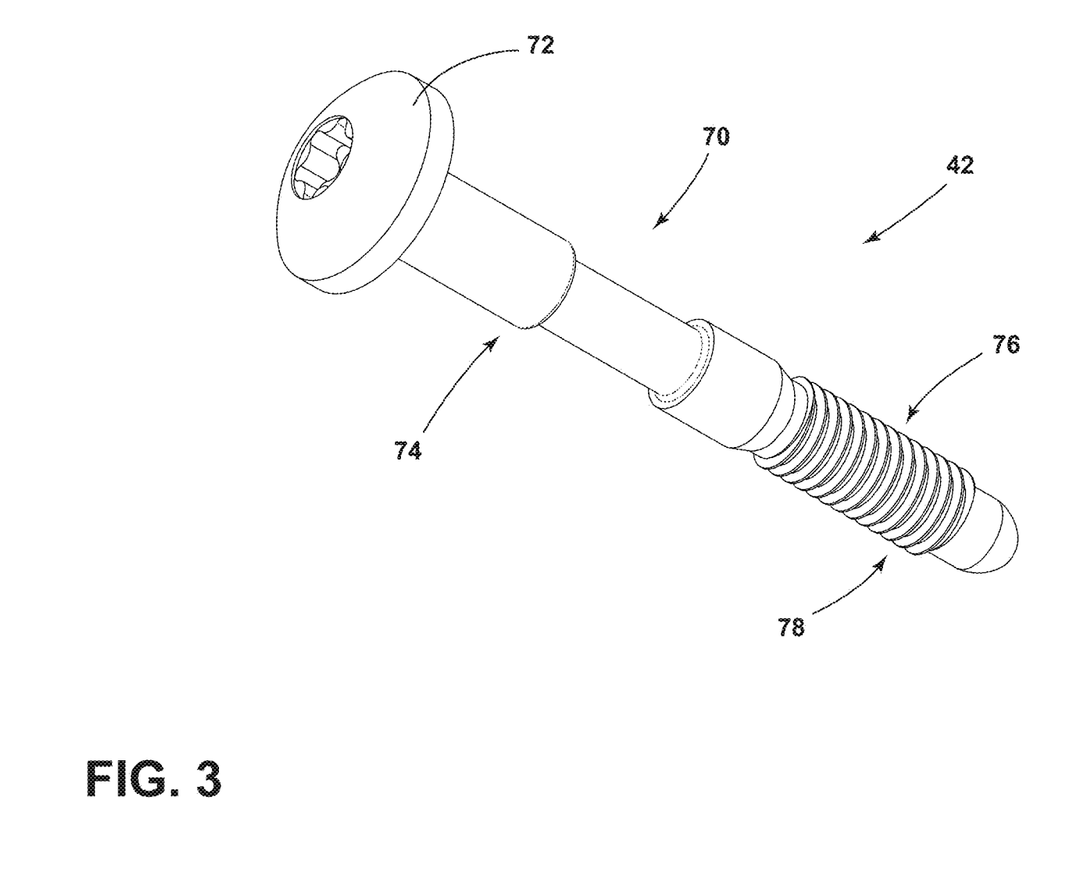
FIG. 3 is a perspective view generally illustrating an embodiment of a fastener.

With embodiments, a fastener 42 may be configured to facilitate a connection between and/or fasten together the first housing member 50, the circuit board 40, the second housing member 52, and/or the third housing member 54. An example of a fastener 42 is generally illustrated in FIG. 3. A fastener 42 may, for example, include a body 70 and/or a head 72. The head 72 may include a larger diameter than some or all of the body 70. The body 70 may include a first portion 74 that may extend from the head 72, and/or a second portion 76 that may extend from the first portion 74. The second portion 76 may be configured to engage (e.g., positively) a bushing 44. For example and without limitation, the second portion 76 may include threads 78 (e.g., external threads) that may engage threads 80 (e.g., internal threads) of a bushing 44. The first portion 74 and/or the second portion 76 may, at least in some configurations, be inserted into the bushing 44, which may or may not include contacting an inner radial surface of the bushing 44. The first portion 74 may, in some configurations, not positively engage the bushing 44. For example and without limitation, the fastener 42 may be configured as a bolt, the first portion 74 may be configured as a shoulder portion, and/or the first portion 74 may include a smooth (e.g., unthreaded) outer surface. The first portion 74 may, in some configurations, be at least as long as a combined length of a first bushing portion 90 and/or a second bushing portion 92 of a bushing 44 (e.g., in a direction perpendicular to the circuit board 40). The head 72 and the second portion 76 may be disposed at opposite ends of the fastener 42.

Figure 2A:
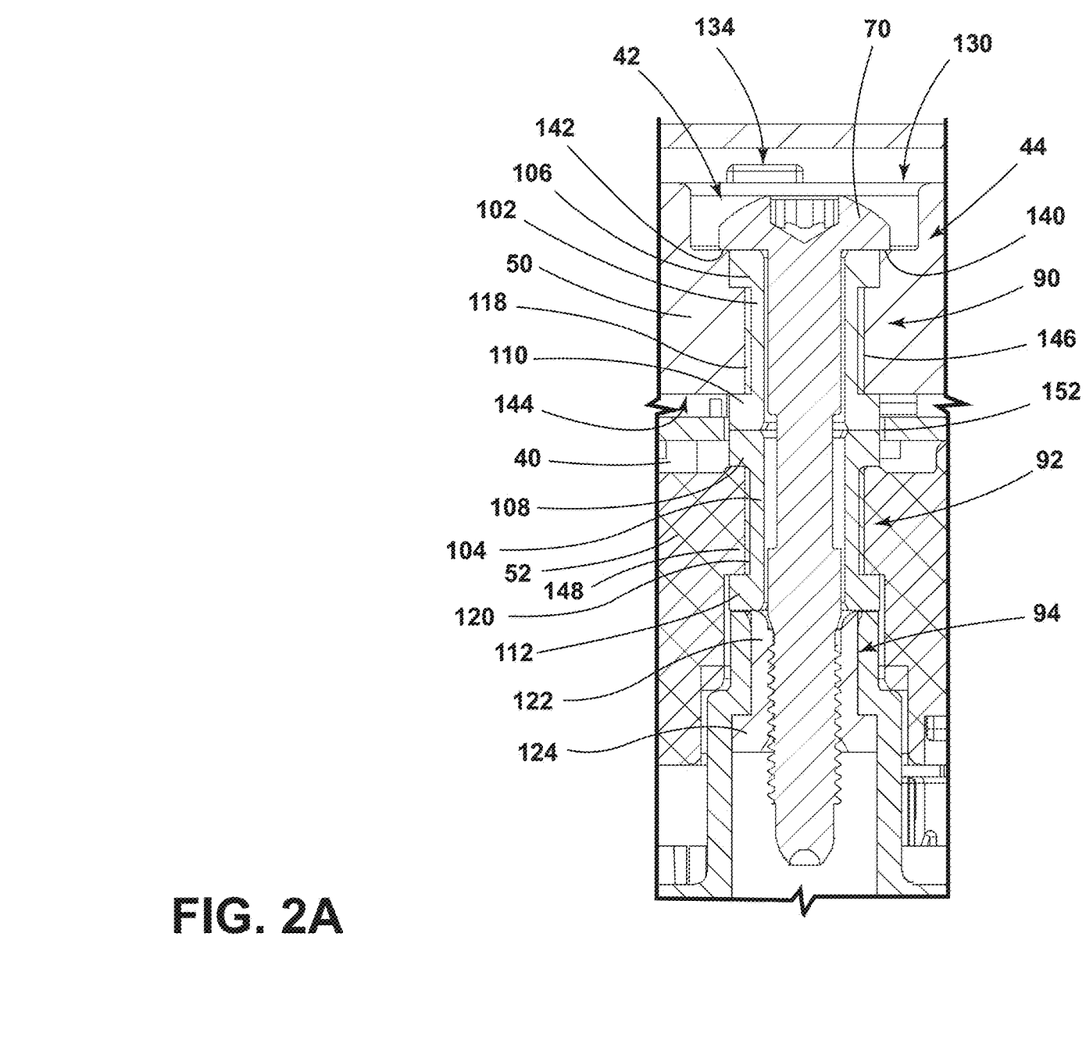
FIG. 2A is an enlarged portion of FIG. 2.

With embodiments, such as generally illustrated in FIGS. 2 and 2A, a bushing 44 may include a first bushing portion 90, a second bushing portion 92, and/or a third bushing portion 94. The bushing 44 may, for example, be configured to limit forces applied to the circuit board 40 and/or to more evenly distribute forces applied to the first housing member 50, the second housing member 52, and/or the third housing member 54. Such forces may be associated with and/or be a result of connecting/assembling the electrical unit 20. For example, assembling an electrical unit 20 may include connecting (e.g., fastening) the first housing member 50, the second housing member 52, and the third housing member 54 together via a fastener 42. The bushing 44 may be configured to limit the amount of force (e.g., fastening force) applied to any particular part of the housing members 50, 52, 54, and/or may limit or substantially prevent fastening forces from being applied to the circuit board 40, such as to limit the potential for damage to the circuit board 40 and/or one or more electrical components 150 that may be connected thereto.

Figure 4:
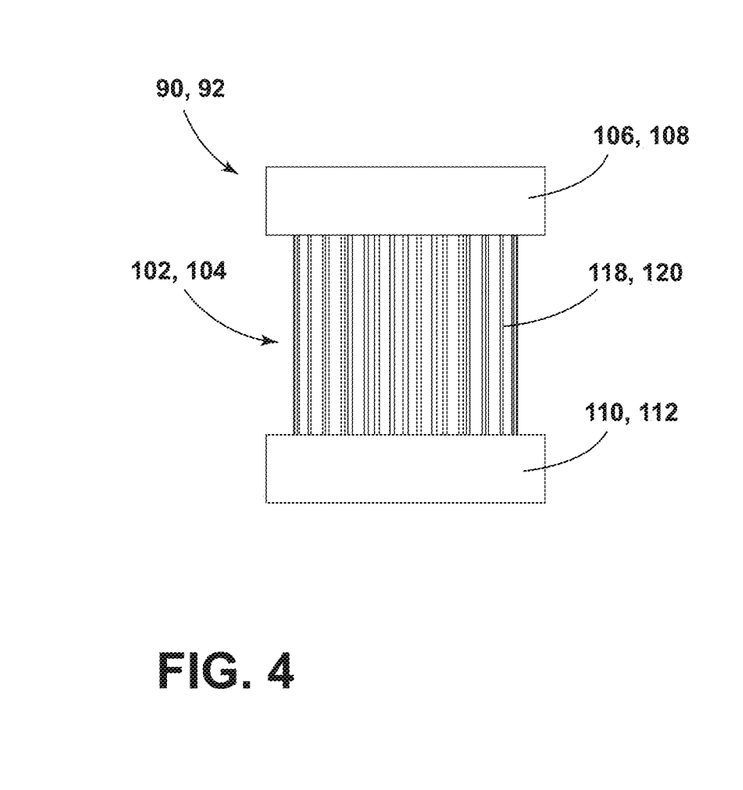
FIG. 4 is a side view generally illustrating an embodiment of a bushing portion.
Figure 5:
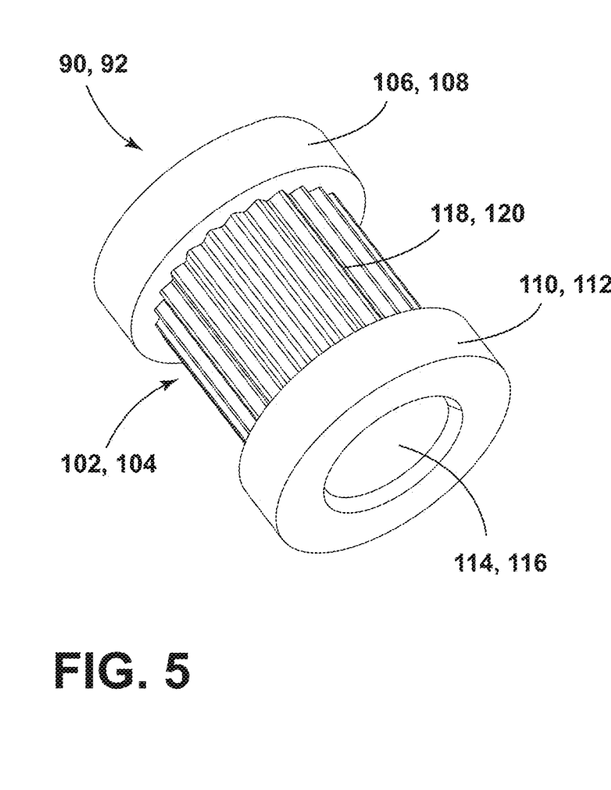
FIG. 5 is a perspective view generally illustrating an embodiment of a bushing portion.

In embodiments, such as generally illustrated in FIGS. 4 and 5, a first bushing portion 90 and/or a second bushing portion 92 of a bushing 44 may include a bushing portion body 102, 104 that may have a generally cylindrical configuration. The first bushing portion 90 may include a first portion first flange 106 and/or a first portion second flange 110 (e.g., radially extending flanges) that may be disposed at or about opposite ends of the first bushing portion 90. The second bushing portion 92 may include a second portion first flange 108 and/or a second portion second flange 112 (e.g., radially extending flanges) that may be disposed at or about opposite ends of the second bushing portion 92. The bushing portion bodies 102, 104 may extend between a first flange 106, 108 and a second flange 110, 112. A bushing portion 90, 92 may include an aperture 114, 116 that may extend through the bushing portion 90, 92 in an axial direction and may be configured to receive the fastener 42. A bushing portion body 102, 104 may include one or more ribs 118, 120 (e.g., axially- and/or radially-extending ribs) that may be disposed at or about an outer surface of the bushing portion body 102, 104. With embodiments, the first bushing portion 90 and the second bushing portion 92 may include a similar or the same configuration. In some configurations, the first bushing portion 90 may be shorter than the first housing member 50 (e.g., in an axial direction), and/or the second bushing portion 92 may be shorter than the second housing member 52.

Figure 6:
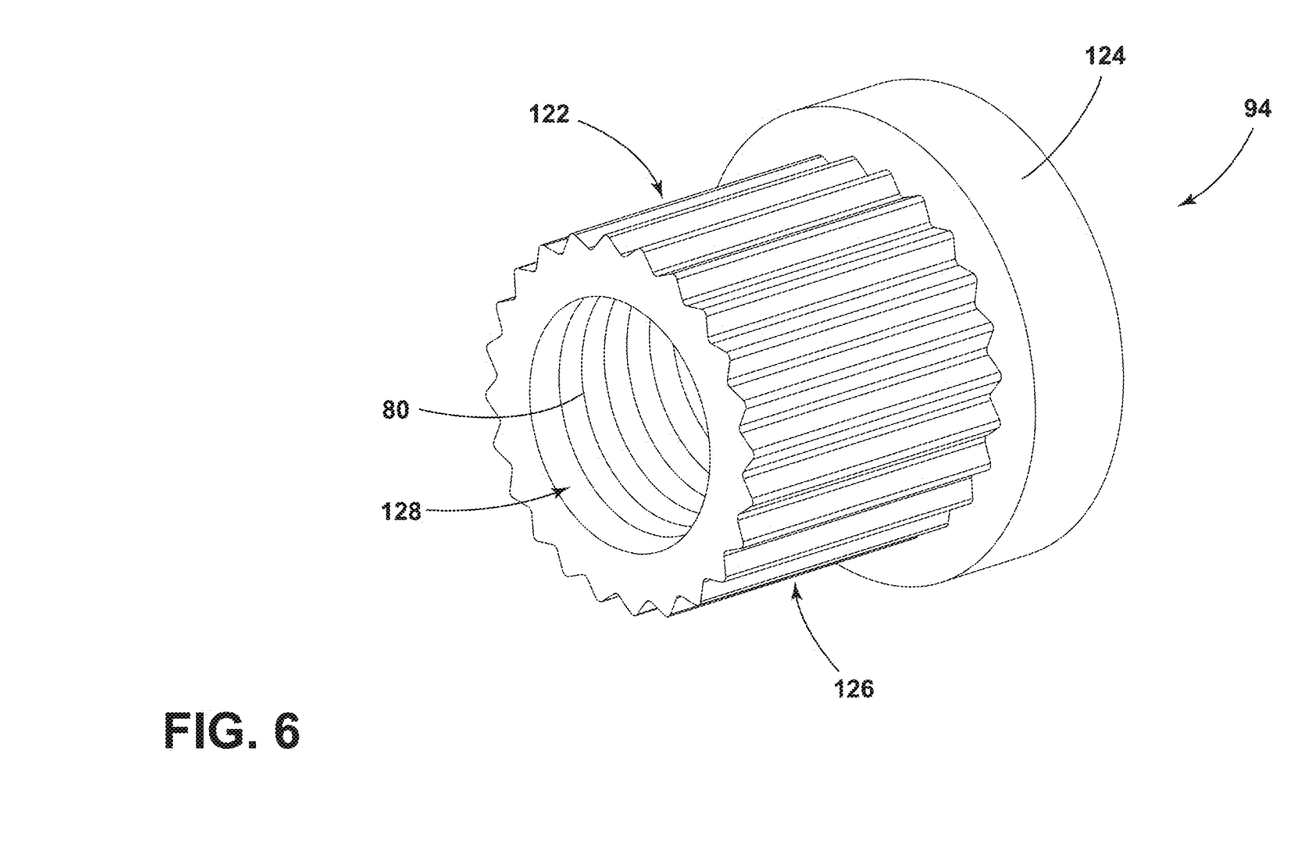
FIG. 6 is a perspective view generally illustrating an embodiment of a bushing portion.

With embodiments, such as generally illustrated in FIG. 6, a third bushing portion 94 of a bushing 44 may include a third bushing portion body 122 that may have a generally cylindrical configuration. The third bushing portion 94 may include a third bushing portion flange 124 that may be disposed at or about a first end of the third bushing portion 94. The opposite/second end of the third bushing portion 94 may or may not include a flange. The third bushing portion body 122 may include one or more ribs 126 that may be configured in the same or a similar manner as ribs 118, 120 of the first and second bushing portions 90, 92. The third bushing portion body 122 may include threads 80 (e.g., internal threads) that may be configured to engage threads 78 of a fastener 42. For example and without limitation, the third bushing portion 94 may function as a nut. In some configurations, the third bushing portion 94 may be shorter than the third housing member 54 (e.g., in an axial direction). The third bushing portion 94 may include an aperture 128 (e.g., a through aperture). The third bushing portion 94 may include a different configuration than the first and second bushing portions 90, 92. For example, the third bushing portion 94 may include one flange 124 and the first and second bushing portions 90, 92 may include two flanges 106, 108, 110, 112.

Figure 7:
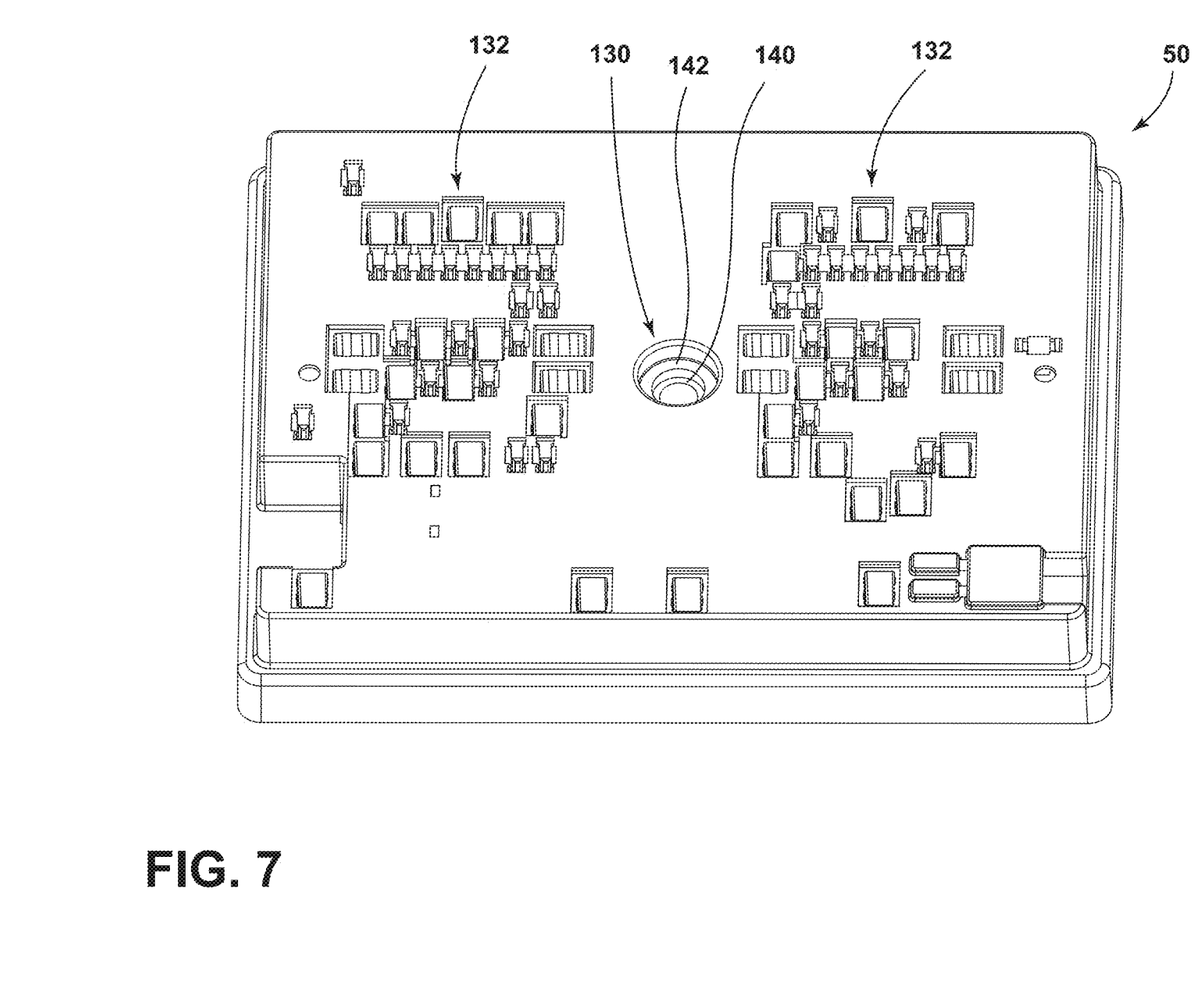
FIG. 7 is a perspective view generally illustrating an embodiment of a first housing member.

With embodiments, such as generally illustrated in FIG. 7, a first housing member 50 may include a generally rectangular or rectangular prism configuration (e.g., with an open bottom), among other possible configurations, may include a first aperture 130, and/or may include one or more second apertures 132. The one or more second apertures 132 may, for example, be configured to at least partially receive respective fuses or other electrical components 134 (e.g., blade fuses). The first aperture 130 may be configured to at least partially receive a fastener 42 and/or a bushing 44, such as a first bushing portion 90. The first aperture 130 may, at least in some configurations, be disposed at or about a center of the first housing member 50. The first housing member 50 and/or the first aperture 130 may include a first housing member first lip 140 and/or a first housing member second lip 142. The first lip 140 and/or the second lip 142 may correspond to portions of the first aperture 130 with increased diameters, such as relative to other portions of the first aperture 130, and/or may include axial surfaces. The second lip 142 may include a larger diameter than the first lip 140, which may provide the lips 140, 142 with a stepped configuration. The stepped configuration may include the diameter of the first aperture 130 decreasing (e.g., in a stepped manner) from a first side (e.g., a top) of the first housing member 50 toward the third housing member 54. The second lip 142 may engage the fastener 42, such as a head 72. For example and without limitation, a fastener 42 may be inserted into the first housing member aperture 130 such that the head 72 is engaged with and/or substantially adjacent to the second lip 142. The first lip 140 may engage a bushing 44, such as a first flange 106 of a first bushing portion 90. A second flange 110 of the first bushing portion 90 may be engaged with an underside/inner surface 144 of the first housing member 50. For example and without limitation, a section 146 of the first housing member 50 may be disposed between the first flange 106 and the second flange 110 of the first bushing portion 90. The section 146 may, additionally or alternatively, be engaged with the one or more ribs 118 of the first bushing portion 90. The first bushing portion 90 may, for example, be secured in the first housing member 50, such as via engagement of the flanges 106, 110 and/or the one or more ribs 118.

Figure 8:
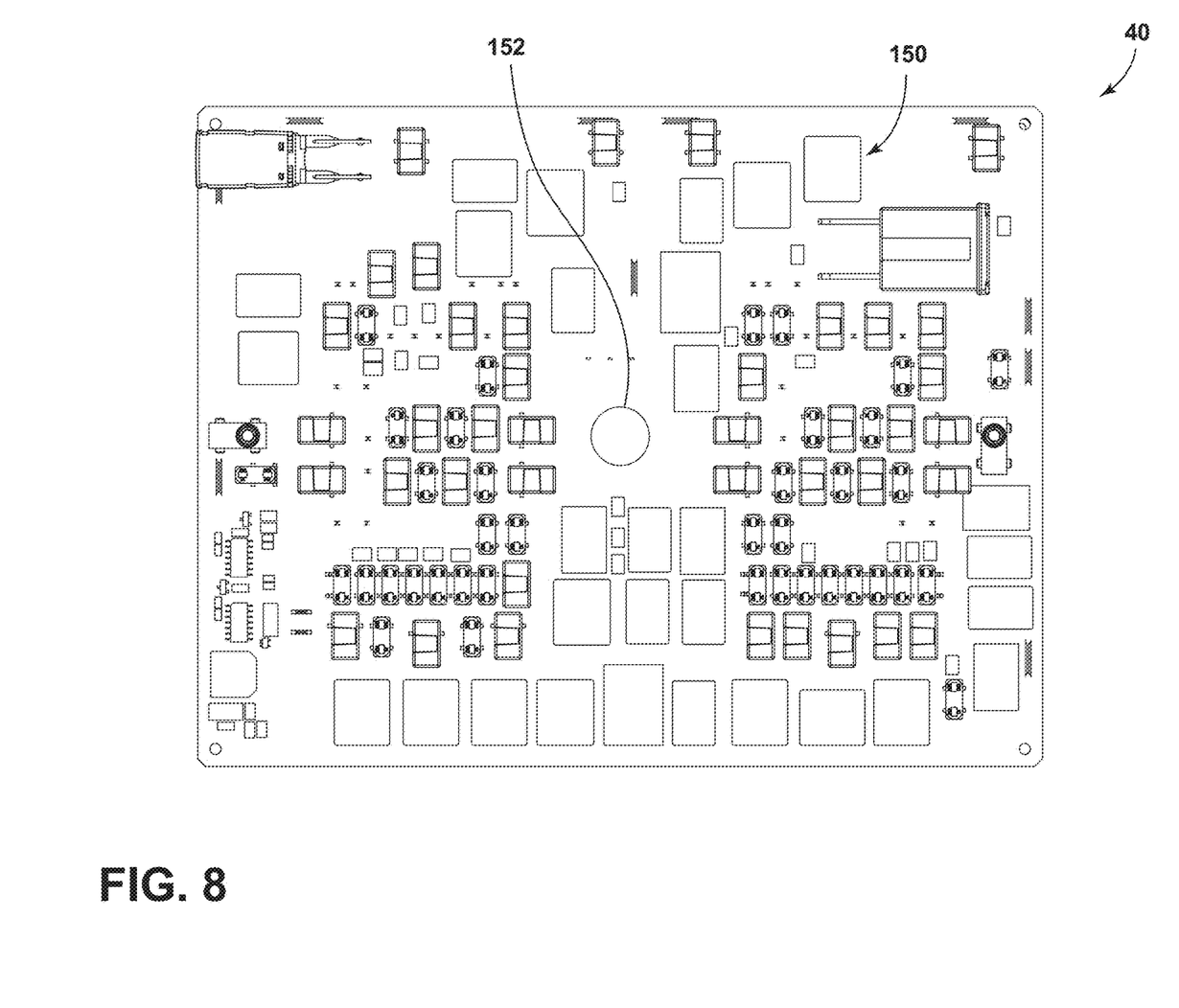
FIG. 8 is a top view generally illustrating an embodiment of a circuit board.

In embodiments, such as generally illustrated in FIG. 8, a circuit board 40 may, for example, include a generally rectangular configuration that may correspond to the configuration of the first housing member 50 and/or the second housing member 52. One or more electrical components 150 may be connected to the circuit board 40. The one or more electrical components 150 may include one or more of a variety of components, such as relays, controllers, capacitors, resistors, inductors, and/or diodes, among others. The one or more electrical components 150 may, at least in part, be configured to distribute electrical power received via the first connector 24 and/or the first cable 30 to the second connector 26, the second cable 32, the third connector 28, and/or the third cable 34.

With embodiments, a circuit board 40 may include a circuit board aperture 152. The circuit board aperture 152 may, at least in some configurations, be disposed at or about a middle of the circuit board 40, and/or may be substantially aligned with the first aperture 130 of the first housing member 50. The diameter of the circuit board aperture 152 may be at least as large as an outer diameter of the first bushing portion 90 and/or the second bushing portion 92. For example and without limitation, the diameter of the circuit board aperture 152 may be larger than outer diameters of the second flange 110 of first bushing portion 90 and the first flange 108 of the second bushing portion 92, such that one or both of the first bushing portion 90 (e.g., second flange 110) and the second bushing portion 92 (e.g., first flange 108) may be disposed in the circuit board aperture 152 without contacting the circuit board 40.

Figure 9:
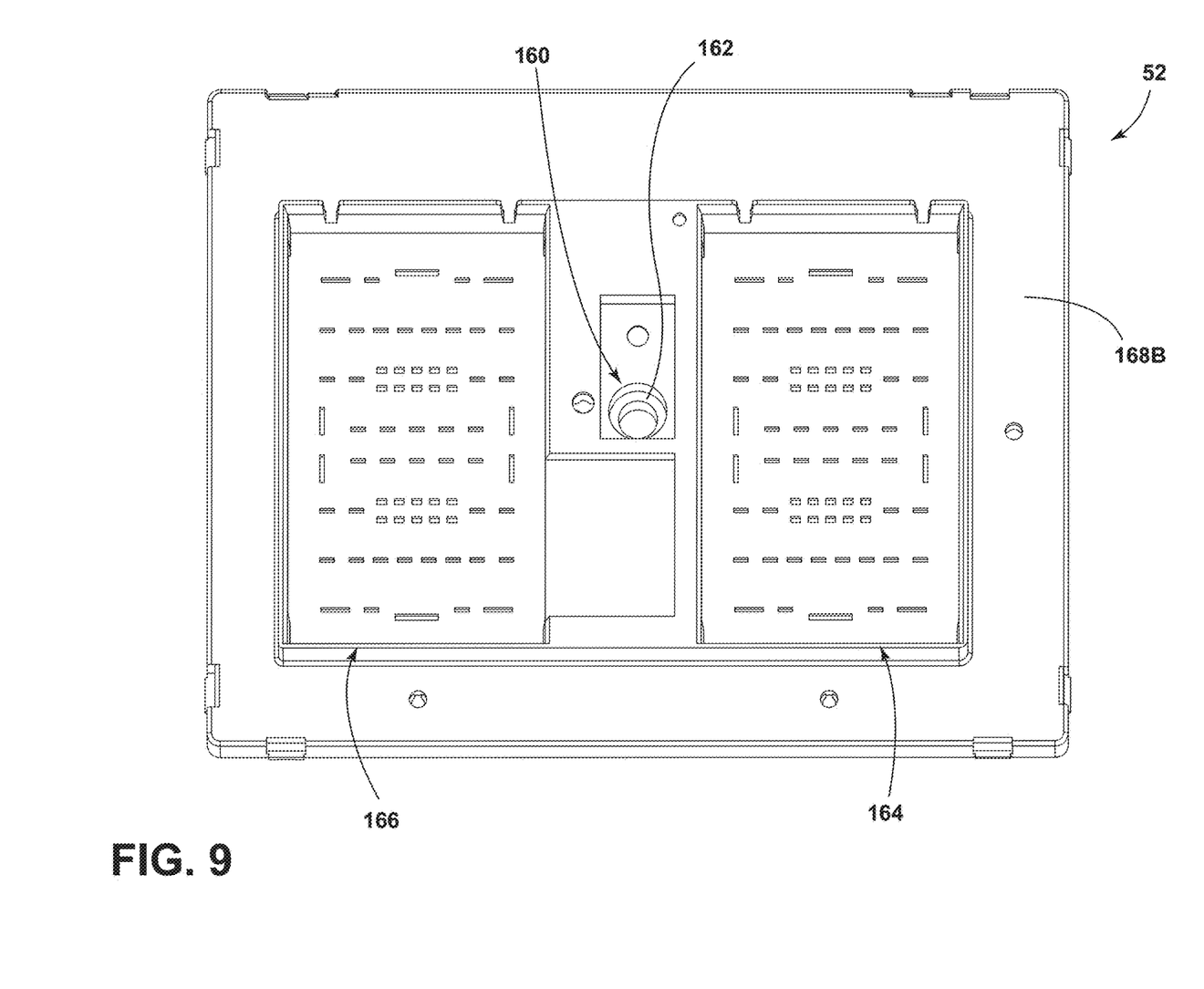
FIG. 9 is a perspective view generally illustrating an embodiment of a second housing member.

In embodiments, such as generally illustrated in FIG. 9, a second housing member 52 may include a generally rectangular configuration, among other possible configurations. The second housing member 52 may include a second housing member aperture 160 that may be disposed at or about a center of the second housing member 52, such as to be substantially aligned with the first aperture 130 of the first housing member 50 and/or with the circuit board aperture 152. The second housing member aperture 160 may include a second housing member lip 162 (e.g., an axial surface, a step, etc.) that may be configured to engage a bushing 44, such as a flange 112 of a second bushing portion 92. The lip 162 may correspond to a portion of the second housing member aperture 160 with an increased diameter. The diameter of the second housing member aperture 160 may, for example, increase (e.g., in a stepped manner) from a first/top side 168A of the second housing member 52, which may be disposed proximate the circuit board 40, toward a second/bottom side 168B of the second housing member 52 and/or toward the third housing member 54. In embodiments, a second housing member 52 may include a first connector recess 164 and/or a second connector recess 166 that may be configured to at least partially receive the first connector 24 and/or the second connector 26. For example and without limitation, the recesses 164, 166 may disposed in the second side 168B of the second housing member 52, which is generally illustrated in FIG. 9, and the second housing member 52 may be disposed (e.g., moved down) over a first electrical connector 24 and/or a second electrical connector 24 such that top portions of the electrical connectors 24, 26 are disposed in the recesses 164, 166 (see, e.g., FIG. 2).

Figure 10:
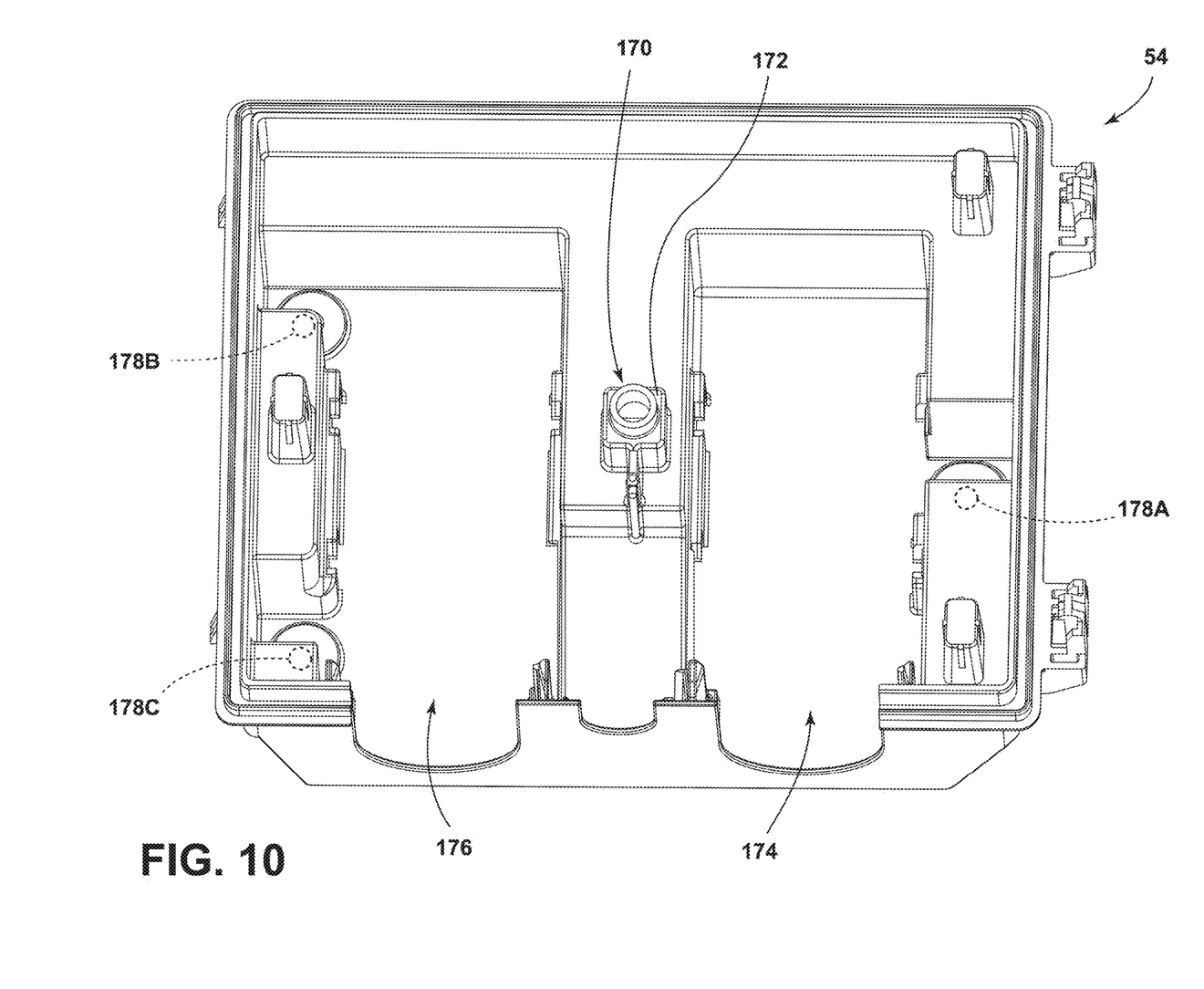
FIG. 10 is a perspective view generally illustrating an embodiment of a third housing member.
Figure 11:
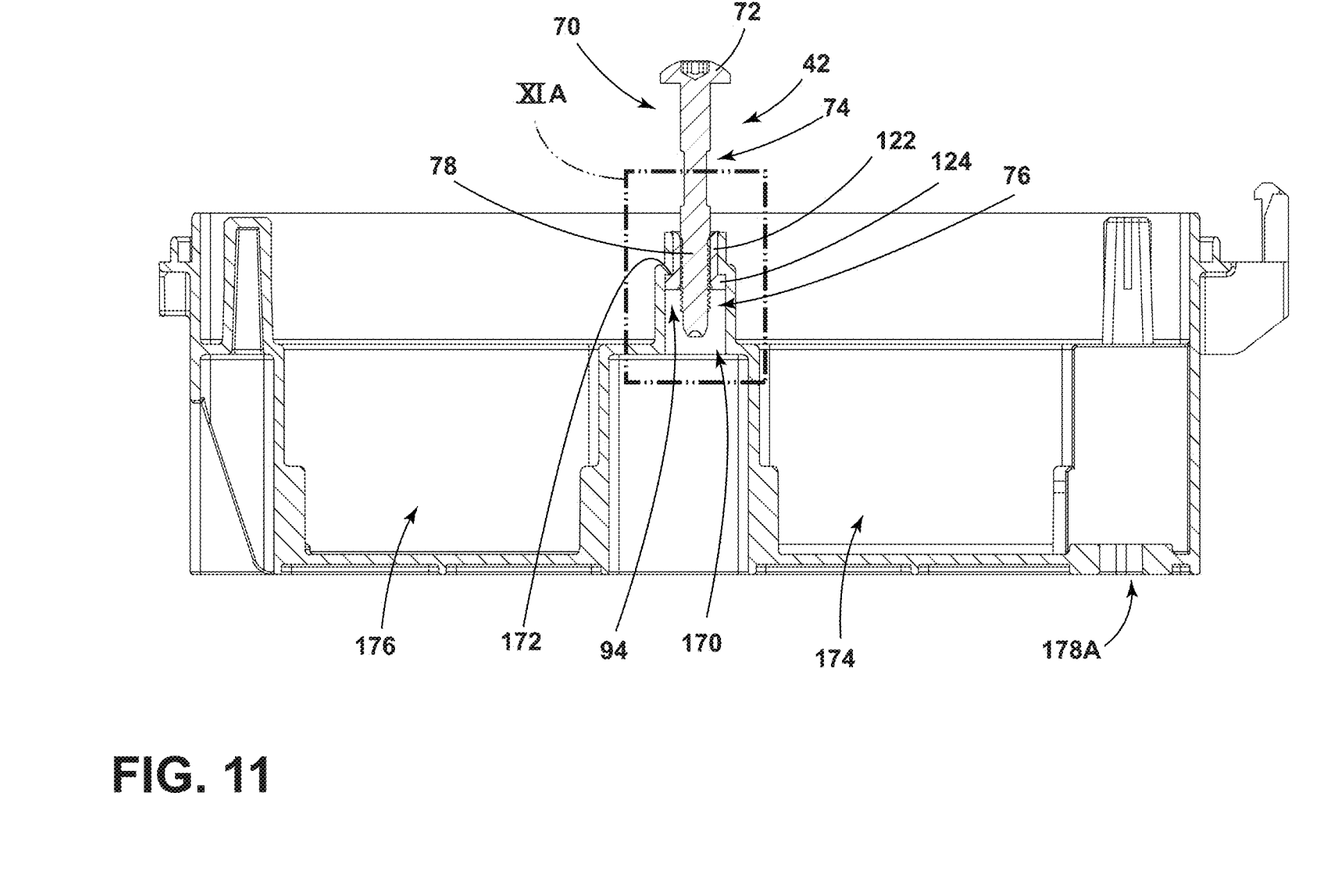
FIG. 11 is a cross-sectional view generally illustrating portions of an embodiment of an electrical unit.
Figure 11A:
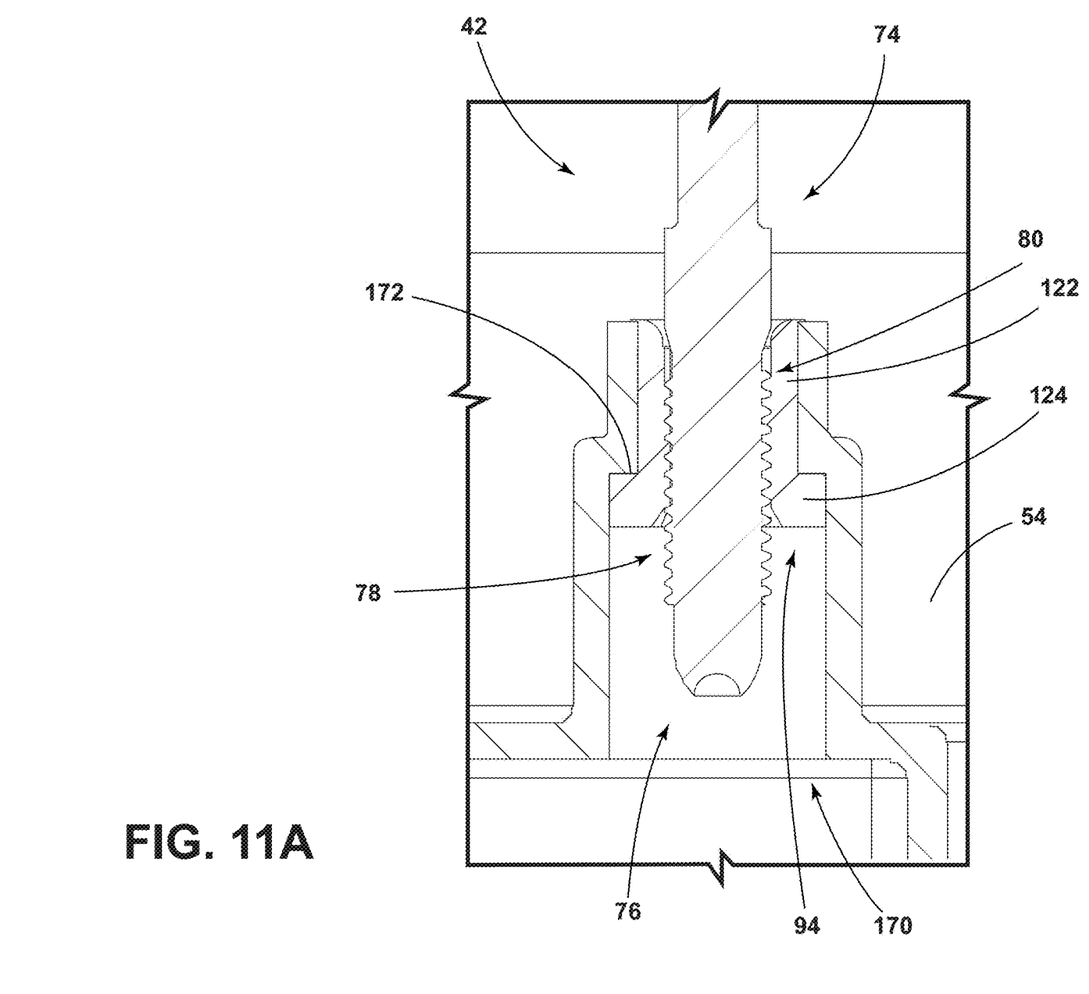
FIG. 11A is an enlarged portion of FIG. 11.

In embodiments, such as generally illustrated in FIGS. 10 and 11, a third housing member 54 may include a generally rectangular configuration, among other possible configurations. The third housing member 54 may include a third housing member aperture 170 that may be disposed at or about a center of the third housing member 54, such as to be substantially aligned with the first aperture 130 of the first housing member 50, the circuit board aperture 152, and/or the second housing member aperture 160. The third housing member aperture 170 may include a third housing member lip 172 (e.g., an axial surface, a step, etc.) that may be configured to engage a bushing 44, such as a flange 124 of a third bushing portion 94 (see, e.g., FIGS. 11 and 11A). The lip 172 may correspond to a portion of the third housing member aperture 170 with an increased diameter. The diameter of the third housing member aperture 170 may, for example, increase (e.g., in a stepped manner) from a first side (e.g., a top) of the third housing member 54, which may be disposed proximate the second housing member 52, toward a second/bottom side of the third housing member 54 that may be connected to a mounting surface 62. In embodiments, a third housing member 54 may include a first connector recess 174 and/or a second connector recess 176 that may be configured to at least partially receive the first connector 24 and/or the second connector 26. For example and without limitation, the recesses 174, 176 may disposed in the first side of the third housing member 54, and a first electrical connector 24 and/or a second electrical connector 24 may be moved down such that bottom portions of the electrical connectors 24, 26 are disposed in the recesses 164, 166. With some configurations, the third housing member 54 may be referred to as a retainer and/or may be configured for mounting an electrical unit 20 on a mounting surface 62 (e.g., may include mounting portions/apertures 178A, 178B, 178C). In some configurations, the third housing member 54 may be taller than the first housing member 50, the second housing member 52, and/or a combined height of the first housing member 50 and the second housing member 52.

Figure 12:
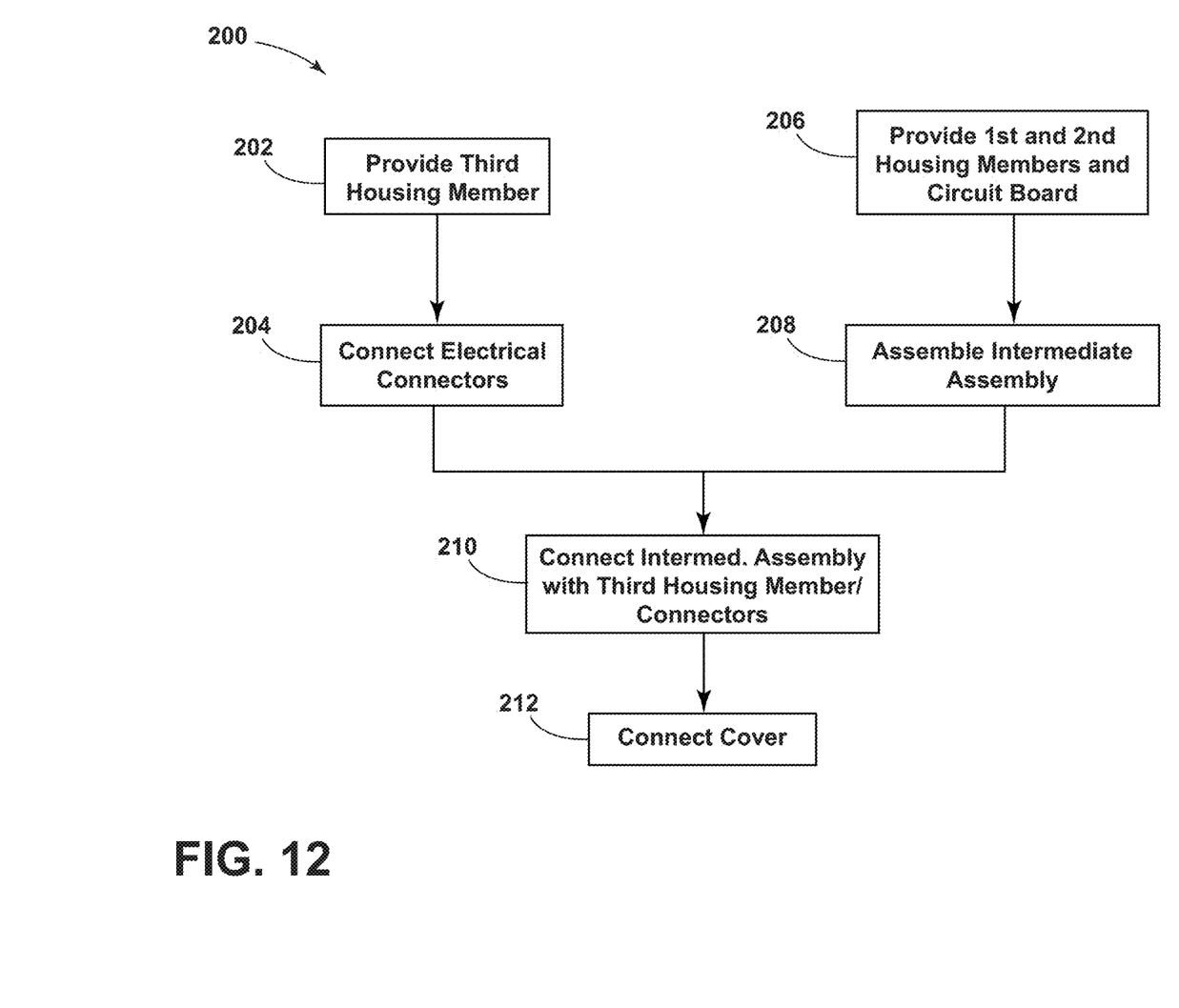
FIG. 12 is a flow chart generally illustrating an embodiment of a method of assembling an electrical unit.

An embodiment of a method 200 of assembling an electrical unit 20 is generally illustrated in FIG. 12. The method 200 may include providing a third housing member 54 (block 202). Providing the third housing member 54 may, at least in some configurations, include forming the third housing member 54 around and/or with a portion of a bushing 44, such as a third bushing portion 94. For example and without limitation, the third housing member 54 may include a polymer that may be molded around the third bushing portion 94, which may comprise a different material, such as metal, that may be stronger than the material of the third housing member 54. In other configurations, the third bushing portion 94 may be formed separately from the third housing member 54 and then inserted into a third housing member aperture 170. In some embodiments, providing the third housing member 54 may include connecting the third housing member 54 to a mounting surface 62 (e.g., before connecting the third housing member 54 with electrical connectors 24, 26, 28, an intermediate assembly, and/or a cover 56). A first electrical connector 24, a second electrical connector 26, and/or a third electrical connector 28 may be inserted into and/or connected with the third housing member 54 (block 204).

In embodiments, the method 200 may include providing a first housing member 50, a second housing member 52, and/or a circuit board 40 (block 206). Providing the first housing member 50 may, at least in some configurations, include forming the first housing member 50 around and/or with a portion of a bushing 44, such as a first bushing portion 90. For example and without limitation, the first housing member 50 may include a polymer that may be molded around the first bushing portion 90, which may comprise a different material, such as metal, that may be stronger than the material of the first housing member 50. A first housing member aperture 130 of the first housing member 50 may be formed at least partially around the first bushing portion 90. For example and without limitation, the first housing member 50 may be formed such that a section 146 of the first housing member 50 is disposed directly between the flanges 106, 110 of the first bushing portion 90 and/or is engaged with/disposed between ribs 118. Such a configuration may secure the first bushing portion 90 with the first housing member 50 and/or in the housing member aperture 130. In other configurations, the first bushing portion 90 may be formed separately from the first housing member 50 and then inserted into a first housing member aperture 130.

Providing the second housing member 52 may, at least in some configurations, include forming the second housing member 52 around and/or with a portion of a bushing 44, such as a second bushing portion 92. For example and without limitation, second housing member 52 may include a polymer that may be molded around the second bushing portion 92, which may comprise a different material, such as metal, that may be stronger than the material of the second housing member 52. A second housing member aperture 160 of the second housing member 52 may be formed at least partially around the second bushing portion 92. For example and without limitation, the second housing member 52 may be formed such that a section 148 of the second housing member 52 is disposed directly between the flanges 108, 112 of the second bushing portion 92 and/or is engaged with/disposed between ribs 120. Such a configuration may secure the second bushing portion 92 with the second housing member 52 and/or in the second housing member aperture 160. The second portion first flange 108 may be engaged with a top/upper side 168A of the second housing member 52, and/or the second portion second flange 112 may be engaged with the second housing member lip 162. In other configurations, the second bushing portion 92 may be formed separately from the second housing member 52 and then inserted into a second housing member aperture 160.

With embodiments, the method 200 may include connecting the first housing member 50, the second housing member 52, and/or the circuit board 40 (block 208), such as to provide an intermediate assembly. The first housing member 50 and the second housing member 52 may be disposed at opposite sides/surfaces of the circuit board 40 such that the circuit board 40 is disposed substantially between the first housing member 50 and the second housing member 52. Additionally or alternatively, the first housing member 50 and/or the second housing member 52 may substantially cover the circuit board 40 such that the circuit board 40 is disposed partially or entirely within an internal space 154 provided by the first housing member 50 and the second housing member 52. The first housing member 50, the second housing member 52, and/or the circuit board 40 may be disposed such that respective apertures 130, 160, 152 and/or bushing portions 90, 92 are substantially aligned, such as to facilitate insertion of a fastener 42. Connecting the first housing member 50, the second housing member 52, and the circuit board 40 may include inserting the first bushing portion 90 (e.g., the flange 110) of the bushing 44 into the aperture 152 of the circuit board 40 and/or inserting the second bushing portion 92 (e.g., the flange 108) of the bushing 44 into the aperture 152. In some configurations, flanges 108, 110 may both be inserted into the aperture 152, such as from opposite directions. The bushing portions 90, 92 may be disposed in contact with each other, such as in a connected/assembled configuration of the intermediate assembly and/or the electrical unit 20. For example, a flange 110 of the first bushing portion 90 may be in contact with and/or abut the flange 108 of the second bushing portion 92.

In embodiments, a bushing 44 (e.g., the bushing portions 90, 92 and/or the flanges 108, 110) may include a smaller diameter than the aperture 152 such that in a connected/assembled configuration there is a radial clearance between the bushing 44 and the circuit board 40 and/or such that contact between the bushing 44 and the circuit board 40 is limited. The bushing 44 may not contact the top or bottom sides of the circuit board 40. With some configurations, the bushing 44 may be designed not to make any contact with the circuit board 40, but manufacturing and/or assembly tolerances may result in some minor contact, such as between an outer radial surface of the bushing 44 (e.g., of flanges 108, 110) and an inner radial surface of the aperture 152.

With embodiments, the method 200 may include connecting the intermediate assembly with the third housing member 54 and/or one or more electrical connectors 24, 26, 28 (block 210). The intermediate assembly may be disposed at least partially in the third housing member 54 and/or such that portions (e.g., top portions) of the first electrical connector 24 and/or the second electrical connector 26 are disposed in recesses 164, 166 of the second housing member 52. The intermediate assembly may be disposed such that the apertures 130, 160, 152 and/or the bushing portions 90, 92 are substantially aligned with an aperture 170 of the third housing member 54 and/or with a third bushing portion 94 of the bushing 44. For example and without limitation, some or all of the apertures 130, 160, 152, 170 and/or the bushing portions 90, 92, 94 may be disposed substantially concentrically. Additionally or alternatively, the second bushing portion 92 (e.g., flange 112) may be disposed in contact with the third bushing portion 94, such as with a second end of the third bushing portion 94 that may be disposed opposite the flange 124. In an assembled configuration, the first bushing portion 90, the second bushing portion 92, and the third bushing portion 94 may be disposed end-to-end in a column that may extend substantially perpendicular to the circuit board 40. In some configurations, the bushing portions 90, 92, 94 may be discrete components that may be formed and/or separately connected with respective housing members 50, 52, 54, and/or that may not be positively engaged with each other.

In embodiments, connecting the intermediate assembly with the third housing member 54 may include connecting the intermediate assembly with the third housing member 54 via a fastener 42. For example and without limitation, fastener 42 may be inserted into and/or through the first housing member aperture 130, the first bushing portion 90, the circuit board aperture 152, the second bushing portion 92, the second housing member aperture 160, the third bushing portion 94, and/or the third housing member aperture 170. In some configurations, the fastener 42 may be inserted in this order, but may be inserted in other orders. The fastener 42 may be rotated (e.g., screwed) into the third bushing portion 94 such that threads 78 of the fastener 42 engage threads 80 of the third bushing portion 94, which may pull and/or secure the intermediate assembly and the third housing member 54 together. For example and without limitation, a head 72 of the fastener 42 may engage the first housing member 50 (e.g., a second lip 142), which may pull the first housing member 50 and/or the intermediate assembly toward the third housing member 54, and/or the third bushing portion 94 may engage the third housing member 54 (e.g., a lip 172), which may pull the third housing member 54 toward the intermediate assembly, such as via a threaded engagement and relative rotation of the fastener 42 and the third bushing portion 94. In an assembled configuration, the fastener 42 may extend beyond a first end and/or a second end of the bushing 44. For example and without limitation, a head 72 of the fastener 42 may be disposed at least partially above the bushing 44 (e.g., above flange 106 of the first bushing portion 90) and/or a second end of the fastener 42 may extend beyond the bottom of the bushing 44 (e.g., below the flange 124 of the third bushing portion 94). The fastener 42 may be longer than a length/height of the bushing 44.

With embodiments, forces associated with fastening/pulling during assembly may be distributed/transferred via the bushing 44 and/or the housing members 50, 52, 54, such as substantially independently of the circuit board 40, which may limit damage to the circuit board 40 and/or electrical components 150 connected thereto. For example, connecting the intermediate assembly with the third housing member 54 may include limiting forces applied to the circuit board 40 via the bushing 44. Additionally or alternatively, the fastener 42 may not contact and/or may not engage the circuit board 40 and/or the second housing member 52.

In embodiments, the method 200 may include connecting a cover 56 with the third housing member 54 and/or the intermediate assembly (block 212). The cover 56 may cover some or all of the intermediate assembly such that the intermediate assembly may not be externally visible.

With embodiments, if a bushing portion 90, 92, 94 is not formed (e.g., molded) in a housing member 50, 52, 54, the bushing portion 90, 92, 94 may include a flange at one end but may not include a flange at an opposite end, such as to facilitate/allow insertion.

With embodiments, a bushing 44 and/or one or more bushing portions 90, 92, 94 may include different and/or stronger materials than the electrical unit housing 22 (e.g., housing members 50, 52, 54). For example and without limitation, a bushing 44 and/or bushing portions 90, 92, 94 may comprise metal (e.g., stainless steel) and the electrical unit housing 22 may comprise plastic.

While embodiments of an electrical unit 20 and portions thereof are generally illustrated with rectangular configurations, electrical units 20 are not limited to such configurations and may include other shapes and sizes.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical unit, comprising:
    an electrical unit housing, including:
        a first housing member;
        a second housing member; and
        a third housing member;
    a circuit board disposed at least partially in the electrical unit housing;
    a fastener disposed at least partially in the first housing member, the second housing member, the third housing member, and the circuit board; and
    a bushing disposed at least partially in the first housing member, the second housing member, and the circuit board;
    wherein the fastener is disposed at least partially in the bushing; and
    the bushing includes a first portion in contact with the first housing member, a second portion in contact with the second housing member, and a third portion in contact with the third housing member.

2. The electrical unit of claim 1, wherein the first housing member is molded around the first portion; and
    the second housing member is molded around the second portion.

3. The electrical unit of claim 2, wherein the third housing member is molded around the third portion of the bushing.

4. The electrical unit of claim 1, wherein the third portion includes an internal threaded portion configured to engage threads of the fastener.

5. The electrical unit of claim 1, wherein one or both of the first portion and the second portion are partially disposed in an aperture of the circuit board.

6. The electrical unit of claim 5, wherein the circuit board is not in contact with the first portion or the second portion.

7. The electrical unit of claim 1, wherein the first portion includes a first portion first flange and a first portion second flange; and
    the second portion includes a second portion first flange and a second portion second flange.

8. The electrical unit of claim 7, wherein the first portion second flange abuts the second portion first flange.

9. The electrical unit of claim 8, wherein the first housing member includes a first housing member lip;
    the first portion first flange is engaged with the first housing member lip;
    the second housing member includes a second housing member lip; and
    the second portion second flange is engaged with the second housing member lip.

10. The electrical unit of claim 9, wherein the third housing member includes a third housing member lip; and
    a third portion flange of the third portion is engaged with the third housing member lip.

11. The electrical unit of claim 10, wherein the first housing member includes a first housing member second lip; and
    a head of the fastener is engaged with the first housing member second lip.

12. The electrical unit of claim 1, wherein the first portion and the second portion include substantially the same configuration.

13. The electrical unit of claim 12, wherein the third portion includes a different configuration than the first portion and the third portion.

14. The electrical unit of claim 1, wherein the first portion is shorter than the first housing member;
    the second portion is shorter than the second housing member; and
    the third portion is shorter than the third housing member.

15. The electrical unit of claim 14, wherein the third housing member is taller than the first housing member and the second housing member.

16. The electrical unit of claim 1, wherein the fastener includes a shoulder portion that is at least as long as a combined length of the first portion and the second portion; and
    the fastener extends beyond a first end of the bushing and a second end of the bushing.

17. A method of assembling an electrical unit, the method comprising:
    disposing a circuit board at least partially between a first housing member and a second housing member of an electrical unit housing;
    connecting the first housing member, the second housing member, and the circuit board to provide an intermediate assembly; and
    connecting the intermediate assembly with a third housing member of the electrical unit housing;
    wherein connecting the intermediate assembly includes inserting a fastener through (i) a first portion of a bushing that is in contact with the first housing member and (ii) a second portion of the bushing that is in contact with the second housing member, and positively engaging the fastener with a third portion of the bushing that is in contact with the third housing member.

18. The method of claim 17, including
    molding the first housing member around the first portion of the bushing; and
    molding the second housing member around the second portion of the bushing.

19. The method of claim 17, wherein connecting the intermediate assembly with the third housing member includes limiting forces applied to the circuit board via the bushing.

20. The method of claim 19, including connecting the third housing member with a mounting surface prior to connecting the intermediate assembly with the third housing member.

* * * * *